US008624374B2

(12) United States Patent
Ding et al.

(10) Patent No.: US 8,624,374 B2
(45) Date of Patent: Jan. 7, 2014

(54) SEMICONDUCTOR DEVICE PACKAGES WITH FAN-OUT AND WITH CONNECTING ELEMENTS FOR STACKING AND MANUFACTURING METHODS THEREOF

(75) Inventors: Yi-Chuan Ding, Kaohsiung (TW); Chia-Ching Chen, Kaohsiung (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 365 days.

(21) Appl. No.: 12/753,840

(22) Filed: Apr. 2, 2010

(65) Prior Publication Data

US 2011/0241193 A1 Oct. 6, 2011

(51) Int. Cl.
*H01L 23/02* (2006.01)
(52) U.S. Cl.
USPC ........... 257/686; 257/700; 257/758; 257/774; 257/E23.169
(58) Field of Classification Search
USPC .................. 257/686, 700, 758, 774, E23.169
See application file for complete search history.

(56) References Cited

U.S. PATENT DOCUMENTS

| | | | |
|---|---|---|---|
| 3,959,874 A | 6/1976 | Coucoulas | |
| 4,783,695 A | 11/1988 | Eichelberger et al. | |
| 5,019,535 A | 5/1991 | Wojnarowski et al. | |
| 5,072,289 A | 12/1991 | Sugimoto et al. | |
| 5,091,769 A | 2/1992 | Eichelberger | |
| 5,111,278 A | 5/1992 | Eichelberger | |
| 5,120,678 A | 6/1992 | Moore et al. | |
| 5,128,831 A | 7/1992 | Fox, III et al. | |
| 5,139,610 A | 8/1992 | Dunaway et al. | |
| 5,149,662 A | 9/1992 | Eichelberger | |
| 5,151,776 A | 9/1992 | Wojnarowski et al. | |
| 5,157,589 A | 10/1992 | Cole, Jr. et al. | |
| 5,207,585 A | 5/1993 | Byrnes et al. | |
| 5,222,014 A | 6/1993 | Lin | |

(Continued)

FOREIGN PATENT DOCUMENTS

| | | |
|---|---|---|
| CN | 1524293 A | 10/2001 |
| JP | 07335783 | 12/1995 |

(Continued)

OTHER PUBLICATIONS

Kuang-Hsiung Chen, et al., "Stackable Semiconductor Device Packages," U.S. Appl. No. 12/507,305, filed Jul. 22, 2009.

(Continued)

*Primary Examiner* — Michelle Mandala
(74) *Attorney, Agent, or Firm* — Foley & Lardner LLP; Cliff Z. Liu; Angela D. Murch

(57) ABSTRACT

An embodiment of a semiconductor device package includes: (1) an interconnection unit including a patterned conductive layer; (2) an electrical interconnect extending substantially vertically from the conductive layer; (3) a semiconductor device adjacent to the interconnection unit and electrically connected to the conductive layer; (4) a package body: (a) substantially covering an upper surface of the interconnection unit and the device; and (b) defining an opening adjacent to an upper surface of the package body and exposing an upper surface of the interconnect; and (5) a connecting element electrically connected to the device, substantially filling the opening, and being exposed at an external periphery of the device package. The upper surface of the interconnect defines a first plane above a second plane defined by at least a portion of the upper surface of the interconnection unit, and below a third plane defined by the upper surface of the package body.

4 Claims, 9 Drawing Sheets

(56) References Cited

U.S. PATENT DOCUMENTS

| | | | |
|---|---|---|---|
| 5,225,023 A | 7/1993 | Wojnarowski et al. |
| 5,241,456 A | 8/1993 | Marcinkiewicz et al. |
| 5,250,843 A | 10/1993 | Eichelberger |
| 5,315,486 A | 5/1994 | Fillion et al. |
| 5,324,687 A | 6/1994 | Wojnarowski |
| 5,353,195 A | 10/1994 | Fillion et al. |
| 5,353,498 A | 10/1994 | Fillion et al. |
| 5,355,580 A | 10/1994 | Tsukada |
| 5,397,997 A | 3/1995 | Tuckerman et al. |
| 5,400,948 A | 3/1995 | Sajja et al. |
| 5,422,513 A | 6/1995 | Marcinkiewicz et al. |
| 5,468,681 A | 11/1995 | Pasch |
| 5,519,936 A | 5/1996 | Andros et al. |
| 5,527,741 A | 6/1996 | Cole et al. |
| 5,546,654 A | 8/1996 | Wojnarowski et al. |
| 5,554,887 A | 9/1996 | Sawai et al. |
| 5,567,656 A | 10/1996 | Chun |
| 5,579,207 A | 11/1996 | Hayden et al. |
| 5,594,275 A | 1/1997 | Kwon et al. |
| 5,608,265 A | 3/1997 | Kitano et al. |
| 5,703,400 A | 12/1997 | Wojnarowski et al. |
| 5,710,062 A | 1/1998 | Sawai et al. |
| 5,714,800 A | 2/1998 | Thompson |
| 5,726,493 A | 3/1998 | Yamashita et al. |
| 5,745,984 A | 5/1998 | Cole, Jr. et al. |
| 5,748,452 A | 5/1998 | Londa |
| 5,763,939 A | 6/1998 | Yamashita |
| 5,834,340 A | 11/1998 | Sawai et al. |
| 5,841,193 A | 11/1998 | Eichelberger |
| 5,844,315 A | 12/1998 | Melton et al. |
| 5,861,666 A | 1/1999 | Bellaar |
| 5,866,952 A | 2/1999 | Wojnarowski et al. |
| 5,883,426 A | 3/1999 | Tokuno et al. |
| 5,889,327 A | 3/1999 | Washida |
| 5,889,655 A | 3/1999 | Barrow |
| 5,892,290 A | 4/1999 | Chakravorty et al. |
| 5,929,521 A | 7/1999 | Wark et al. |
| 5,973,393 A | 10/1999 | Chia et al. |
| 5,985,695 A | 11/1999 | Freyman et al. |
| 6,046,071 A | 4/2000 | Sawai et al. |
| 6,072,236 A | 6/2000 | Akram et al. |
| 6,080,932 A | 6/2000 | Smith et al. |
| 6,159,767 A | 12/2000 | Eichelberger |
| 6,177,724 B1 | 1/2001 | Sawai |
| 6,194,250 B1 | 2/2001 | Melton et al. |
| 6,195,268 B1 | 2/2001 | Eide |
| 6,232,151 B1 | 5/2001 | Ozmat et al. |
| 6,239,482 B1 | 5/2001 | Fillion et al. |
| 6,265,765 B1 | 7/2001 | DiStefano et al. |
| 6,294,406 B1 | 9/2001 | Bertin et al. |
| 6,294,741 B1 | 9/2001 | Cole, Jr. et al. |
| 6,303,997 B1 | 10/2001 | Lee |
| 6,306,680 B1 | 10/2001 | Fillion et al. |
| 6,358,780 B1 | 3/2002 | Smith et al. |
| 6,377,461 B1 | 4/2002 | Ozmat et al. |
| 6,396,148 B1 | 5/2002 | Eichelberger et al. |
| 6,426,545 B1 | 7/2002 | Eichelberger et al. |
| 6,448,665 B1 | 9/2002 | Nakazawa et al. |
| 6,451,624 B1 | 9/2002 | Farnworth et al. |
| 6,461,881 B1 | 10/2002 | Farnworth et al. |
| 6,486,006 B2 | 11/2002 | Hirano et al. |
| 6,489,676 B2 | 12/2002 | Taniguchi et al. |
| 6,501,165 B1 | 12/2002 | Farnworth et al. |
| 6,513,236 B2 | 2/2003 | Tsukamoto |
| 6,521,995 B1 | 2/2003 | Akram et al. |
| 6,525,413 B1 | 2/2003 | Cloud et al. |
| 6,555,908 B1 | 4/2003 | Eichelberger |
| 6,586,822 B1 | 7/2003 | Vu et al. |
| 6,614,104 B2 | 9/2003 | Farnworth et al. |
| 6,617,687 B2 | 9/2003 | Akram et al. |
| 6,680,529 B2 | 1/2004 | Chen et al. |
| 6,701,614 B2 | 3/2004 | Ding et al. |
| 6,740,546 B2 | 5/2004 | Corisis et al. |
| 6,740,964 B2 | 5/2004 | Sasaki |
| 6,762,503 B2 | 7/2004 | Lee |
| 6,780,746 B2 | 8/2004 | Kinsman et al. |
| 6,787,392 B2 | 9/2004 | Quah |
| 6,798,057 B2 | 9/2004 | Bolkin et al. |
| 6,812,066 B2 | 11/2004 | Taniguchi et al. |
| 6,815,254 B2 | 11/2004 | Mistry et al. |
| 6,818,544 B2 | 11/2004 | Eichelberger et al. |
| 6,828,665 B2 | 12/2004 | Pu et al. |
| 6,838,776 B2 | 1/2005 | Leal et al. |
| 6,845,554 B2 | 1/2005 | Frankowsky et al. |
| 6,847,109 B2 | 1/2005 | Shim |
| 6,861,288 B2 | 3/2005 | Shim et al. |
| 6,888,255 B2 | 5/2005 | Murtuza et al. |
| 6,921,683 B2 | 7/2005 | Nakayama |
| 6,921,975 B2 | 7/2005 | Leal et al. |
| 6,924,550 B2 | 8/2005 | Corisis et al. |
| 6,936,930 B2 | 8/2005 | Wang |
| 6,953,708 B2 | 10/2005 | Hedler et al. |
| 6,974,334 B2 | 12/2005 | Hung |
| 7,002,805 B2 | 2/2006 | Lee |
| 7,015,075 B2 | 3/2006 | Fay et al. |
| 7,015,571 B2 | 3/2006 | Chang et al. |
| 7,026,709 B2 | 4/2006 | Tsai et al. |
| 7,029,953 B2 | 4/2006 | Sasaki |
| 7,034,386 B2 | 4/2006 | Kurita |
| 7,045,908 B2 | 5/2006 | Ohsumi |
| 7,048,450 B2 | 5/2006 | Beer et al. |
| 7,049,692 B2 | 5/2006 | Nishimura et al. |
| 7,061,079 B2 | 6/2006 | Weng et al. |
| 7,071,028 B2 | 7/2006 | Koike et al. |
| 7,087,991 B2 | 8/2006 | Chen et al. |
| 7,091,595 B2 | 8/2006 | Fuergut et al. |
| 7,112,467 B2 | 9/2006 | Eichelberger et al. |
| 7,129,576 B2 | 10/2006 | Humpston |
| 7,141,884 B2 | 11/2006 | Kojima et al. |
| 7,145,228 B2 | 12/2006 | Yean et al. |
| 7,163,843 B2 | 1/2007 | Kiendl et al. |
| 7,173,330 B2 * | 2/2007 | Eng et al. ............... 257/700 |
| 7,185,426 B1 | 3/2007 | Hiner et al. |
| 7,187,068 B2 | 3/2007 | Suh et al. |
| 7,221,045 B2 | 5/2007 | Park et al. |
| 7,242,081 B1 | 7/2007 | Lee |
| 7,262,080 B2 | 8/2007 | Go et al. |
| 7,279,784 B2 | 10/2007 | Liu |
| 7,279,789 B2 | 10/2007 | Cheng |
| 7,288,835 B2 | 10/2007 | Yim et al. |
| 7,294,791 B2 | 11/2007 | Danoski et al. |
| 7,309,913 B2 | 12/2007 | Shim et al. |
| 7,344,917 B2 | 3/2008 | Gautham |
| 7,345,361 B2 | 3/2008 | Mallik et al. |
| 7,354,800 B2 | 4/2008 | Carson |
| 7,361,533 B1 | 4/2008 | Huemoeller et al. |
| 7,361,987 B2 | 4/2008 | Leal et al. |
| 7,364,944 B2 | 4/2008 | Huang et al. |
| 7,364,945 B2 | 4/2008 | Shim et al. |
| 7,364,948 B2 | 4/2008 | Lai et al. |
| 7,365,427 B2 | 4/2008 | Lu et al. |
| 7,371,617 B2 | 5/2008 | Tsai et al. |
| 7,372,141 B2 | 5/2008 | Karnezos et al. |
| 7,372,151 B1 | 5/2008 | Fan et al. |
| 7,394,663 B2 | 7/2008 | Yamashita et al. |
| 7,408,244 B2 | 8/2008 | Lee et al. |
| 7,417,329 B2 | 8/2008 | Chuang et al. |
| 7,425,464 B2 | 9/2008 | Fay et al. |
| 7,429,786 B2 | 9/2008 | Karnezos et al. |
| 7,429,787 B2 | 9/2008 | Karnezos et al. |
| 7,436,055 B2 | 10/2008 | Hu |
| 7,436,074 B2 | 10/2008 | Pan et al. |
| 7,453,148 B2 | 11/2008 | Yang et al. |
| 7,473,629 B2 | 1/2009 | Tai et al. |
| 7,476,563 B2 | 1/2009 | Mangrum et al. |
| 7,482,198 B2 | 1/2009 | Bauer et al. |
| 7,485,970 B2 | 2/2009 | Hsu et al. |
| 7,501,310 B2 | 3/2009 | Yang et al. |
| 7,511,365 B2 | 3/2009 | Wu et al. |
| 7,514,767 B2 | 4/2009 | Yang |
| 7,550,832 B2 | 6/2009 | Weng et al. |
| 7,550,836 B2 | 6/2009 | Chou et al. |
| 7,560,818 B2 | 7/2009 | Tsai |
| 7,566,969 B2 | 7/2009 | Shimanuki |

(56) References Cited

U.S. PATENT DOCUMENTS

| | | |
|---|---|---|
| 7,575,173 B2 | 8/2009 | Fuergut et al. |
| 7,586,184 B2 | 9/2009 | Hung et al. |
| 7,588,951 B2 | 9/2009 | Mangrum et al. |
| 7,589,408 B2 | 9/2009 | Weng et al. |
| 7,595,226 B2 | 9/2009 | Lytle et al. |
| 7,595,553 B2 | 9/2009 | Nagamatsu et al. |
| 7,619,304 B2 | 11/2009 | Bauer et al. |
| 7,619,901 B2 | 11/2009 | Eichelberger et al. |
| 7,622,733 B2 | 11/2009 | Fuergut et al. |
| 7,633,765 B1 | 12/2009 | Scanlon et al. |
| 7,642,133 B2 | 1/2010 | Wu et al. |
| 7,655,501 B2 | 2/2010 | Yang et al. |
| 7,662,667 B2 | 2/2010 | Shen |
| 7,667,318 B2 | 2/2010 | Yang et al. |
| 7,671,457 B1 | 3/2010 | Hiner et al. |
| 7,675,157 B2 | 3/2010 | Liu et al. |
| 7,692,286 B1 | 4/2010 | Huemoeller et al. |
| 7,714,431 B1 | 5/2010 | Huemoeller et al. |
| 7,719,094 B2 | 5/2010 | Wu et al. |
| 7,723,839 B2 | 5/2010 | Yano et al. |
| 7,727,803 B2 | 6/2010 | Yamagata |
| 7,728,431 B2 | 6/2010 | Harada et al. |
| 7,732,242 B2 | 6/2010 | Brunnbauer et al. |
| 7,737,539 B2 | 6/2010 | Kwon et al. |
| 7,737,565 B2 | 6/2010 | Coffy |
| 7,741,151 B2 | 6/2010 | Amrine et al. |
| 7,759,163 B2 | 7/2010 | Kroeninger et al. |
| 7,763,976 B2 | 7/2010 | Tang et al. |
| 7,767,495 B2 | 8/2010 | Fuergut et al. |
| 7,777,351 B1 | 8/2010 | Berry et al. |
| 7,799,602 B2 | 9/2010 | Pagaila et al. |
| 7,807,512 B2 | 10/2010 | Lee et al. |
| 7,812,434 B2 | 10/2010 | Yang |
| 7,829,987 B2 | 11/2010 | Chia |
| 7,830,004 B2 | 11/2010 | Wu et al. |
| 7,834,464 B2 | 11/2010 | Meyer et al. |
| 7,838,334 B2 | 11/2010 | Yu et al. |
| 7,932,599 B2 | 4/2011 | Kiendl et al. |
| 7,948,090 B2 | 5/2011 | Manepalli et al. |
| 8,017,515 B2 * | 9/2011 | Marimuthu et al. .......... 438/612 |
| 8,035,213 B2 | 10/2011 | Lee et al. |
| 8,039,303 B2 | 10/2011 | Shim et al. |
| 8,110,916 B2 | 2/2012 | Weng et al. |
| 8,193,647 B2 | 6/2012 | Hsieh et al. |
| 8,278,746 B2 | 10/2012 | Ding et al. |
| 2003/0090883 A1 * | 5/2003 | Asahi et al. .................... 361/761 |
| 2003/0129272 A1 | 7/2003 | Shen et al. |
| 2004/0012099 A1 | 1/2004 | Nakayama |
| 2004/0106232 A1 | 6/2004 | Sakuyama et al. |
| 2004/0124515 A1 | 7/2004 | Tao et al. |
| 2004/0126927 A1 | 7/2004 | Lin et al. |
| 2004/0155354 A1 | 8/2004 | Hanaoka et al. |
| 2004/0178500 A1 | 9/2004 | Usui |
| 2004/0191955 A1 | 9/2004 | Joshi et al. |
| 2005/0054187 A1 | 3/2005 | Ding et al. |
| 2005/0117835 A1 | 6/2005 | Nguyen et al. |
| 2005/0121764 A1 | 6/2005 | Mallik et al. |
| 2005/0253244 A1 | 11/2005 | Chang |
| 2006/0035409 A1 | 2/2006 | Suh et al. |
| 2006/0065387 A1 | 3/2006 | Tonapi et al. |
| 2006/0071315 A1 | 4/2006 | Oh et al. |
| 2006/0170112 A1 | 8/2006 | Tanaka et al. |
| 2006/0220210 A1 | 10/2006 | Karnezos et al. |
| 2006/0231944 A1 | 10/2006 | Huang et al. |
| 2006/0240595 A1 | 10/2006 | Lee |
| 2006/0244117 A1 | 11/2006 | Karnezos et al. |
| 2007/0029668 A1 | 2/2007 | Lin et al. |
| 2007/0069389 A1 | 3/2007 | Wollanke et al. |
| 2007/0090508 A1 | 4/2007 | Lin et al. |
| 2007/0096311 A1 * | 5/2007 | Humpston et al. ............ 257/734 |
| 2007/0108583 A1 | 5/2007 | Shim et al. |
| 2007/0170595 A1 | 7/2007 | Sinha |
| 2007/0176281 A1 | 8/2007 | Kim et al. |
| 2007/0190690 A1 | 8/2007 | Chow et al. |
| 2007/0222054 A1 | 9/2007 | Hembree |
| 2007/0234563 A1 | 10/2007 | Sakaguchi et al. |
| 2007/0241453 A1 | 10/2007 | Ha et al. |
| 2007/0273049 A1 | 11/2007 | Khan et al. |
| 2007/0290376 A1 | 12/2007 | Zhao et al. |
| 2008/0017968 A1 | 1/2008 | Choi et al. |
| 2008/0073769 A1 | 3/2008 | Wu et al. |
| 2008/0116574 A1 | 5/2008 | Fan |
| 2008/0137314 A1 | 6/2008 | Salama et al. |
| 2008/0230887 A1 | 9/2008 | Sun et al. |
| 2008/0296697 A1 | 12/2008 | Hsu et al. |
| 2008/0316714 A1 | 12/2008 | Eichelberger et al. |
| 2009/0075428 A1 | 3/2009 | Tang et al. |
| 2009/0101400 A1 * | 4/2009 | Yamakoshi ................... 174/260 |
| 2009/0102066 A1 | 4/2009 | Lee et al. |
| 2009/0127686 A1 | 5/2009 | Yang et al. |
| 2009/0129037 A1 | 5/2009 | Yoshino |
| 2009/0224391 A1 * | 9/2009 | Lin et al. ....................... 257/690 |
| 2009/0236686 A1 | 9/2009 | Shim et al. |
| 2009/0261466 A1 | 10/2009 | Pagaila et al. |
| 2010/0000775 A1 | 1/2010 | Shen et al. |
| 2010/0006330 A1 | 1/2010 | Fu et al. |
| 2010/0006994 A1 | 1/2010 | Shim et al. |
| 2010/0013081 A1 | 1/2010 | Toh et al. |
| 2010/0019370 A1 | 1/2010 | Pressel et al. |
| 2010/0032821 A1 | 2/2010 | Pagaila et al. |
| 2010/0059898 A1 | 3/2010 | Keeth et al. |
| 2010/0072599 A1 | 3/2010 | Camacho et al. |
| 2010/0072618 A1 | 3/2010 | Camacho et al. |
| 2010/0084759 A1 | 4/2010 | Shen |
| 2010/0096739 A1 | 4/2010 | Kawabata et al. |
| 2010/0109132 A1 | 5/2010 | Ko et al. |
| 2010/0133704 A1 | 6/2010 | Marimuthu et al. |
| 2010/0171205 A1 | 7/2010 | Chen et al. |
| 2010/0171206 A1 | 7/2010 | Chu et al. |
| 2010/0171207 A1 | 7/2010 | Shen et al. |
| 2010/0214780 A1 | 8/2010 | Villard |
| 2010/0224983 A1 | 9/2010 | Huang et al. |
| 2010/0244208 A1 | 9/2010 | Pagaila et al. |
| 2010/0308449 A1 | 12/2010 | Yang et al. |
| 2010/0314746 A1 | 12/2010 | Hsieh et al. |
| 2010/0320585 A1 | 12/2010 | Jiang et al. |
| 2010/0320593 A1 | 12/2010 | Weng et al. |
| 2011/0018118 A1 | 1/2011 | Hsieh et al. |
| 2011/0018124 A1 | 1/2011 | Yang et al. |
| 2011/0037169 A1 | 2/2011 | Pagaila et al. |
| 2011/0049704 A1 | 3/2011 | Sun et al. |
| 2011/0068453 A1 | 3/2011 | Cho et al. |
| 2011/0068459 A1 | 3/2011 | Pagaila et al. |
| 2011/0074008 A1 | 3/2011 | Hsieh |
| 2011/0115060 A1 | 5/2011 | Chiu et al. |
| 2011/0117700 A1 | 5/2011 | Weng et al. |
| 2011/0127654 A1 | 6/2011 | Weng et al. |
| 2011/0140364 A1 | 6/2011 | Head |
| 2011/0156251 A1 | 6/2011 | Chu et al. |
| 2011/0169150 A1 | 7/2011 | Su et al. |
| 2011/0177654 A1 * | 7/2011 | Lee et al. ....................... 438/107 |
| 2011/0194265 A1 | 8/2011 | Su et al. |
| 2011/0227219 A1 * | 9/2011 | Alvarado et al. ............. 257/738 |
| 2011/0227220 A1 | 9/2011 | Chen et al. |
| 2011/0241192 A1 | 10/2011 | Ding et al. |
| 2011/0241194 A1 | 10/2011 | Chen et al. |
| 2011/0278741 A1 | 11/2011 | Chua et al. |
| 2011/0309488 A1 | 12/2011 | Pagaila |
| 2012/0038053 A1 | 2/2012 | Oh et al. |
| 2012/0056321 A1 | 3/2012 | Pagaila |
| 2012/0077311 A1 | 3/2012 | Kim et al. |
| 2012/0119373 A1 | 5/2012 | Hunt |
| 2012/0153472 A1 | 6/2012 | Pagaila et al. |
| 2012/0153493 A1 | 6/2012 | Lee et al. |
| 2012/0175732 A1 | 7/2012 | Lin et al. |
| 2012/0199972 A1 | 8/2012 | Pagaila et al. |

FOREIGN PATENT DOCUMENTS

| | | |
|---|---|---|
| JP | 2000-294720 | 10/2000 |
| JP | 2001298115 | 10/2001 |
| JP | 2002158312 | 5/2002 |
| JP | 2002170906 | 6/2002 |
| JP | 2004327855 | 11/2004 |

(56) References Cited

FOREIGN PATENT DOCUMENTS

| | | |
|---|---|---|
| JP | 2009054686 | 3/2009 |
| KR | 20020043435 | 6/2002 |
| KR | 20030001963 | 1/2003 |
| TW | 529155 | 4/2003 |
| TW | 229927 | 3/2005 |
| TW | 200611305 | 11/2006 |
| TW | 200739875 | 10/2007 |
| TW | 200828540 | 7/2008 |
| WO | WO 0233751 | 4/2002 |

OTHER PUBLICATIONS

Ming-Chiang Lee, et al., "Wafer-Level Semiconductor Device Packages With Three-dimensional Fan-Out and Manufacturing Methods Therefor," U.S. Appl. No. 12/691,660, filed Jan. 21, 2010.

Yoshida et al., A Study on Package Stacking Process for Package-on-Package (PoP) Electronic Components and Tech. Conf. (ECTC), May 2006, San Diego, CA.

Dreiza et al., "High Density PoP (Package-on-Package) and Package Stacking Development" Electronic Components and Technology Conf. (May 2007).

Ding et al., U.S. Appl. No. 12/753,837, filed Apr. 2, 2010 for "Wafer-Level Semiconductor Device Packages with Stacking Functionality."

Chen et al., U.S. Appl. No. 12/753,843, filed Apr. 2, 2010 for "Stacked Semiconductor Device Package Assemblies with Reduced Wire Sweep and Manufacturing Methods Thereof."

Lee et al., U.S. Appl. No. 12/972,046, filed Dec. 17, 2010 for "Embedded Component Device and Manufacturing Methods Thereof."

Hunt et al., U.S. Appl. No. 12/944,697, filed Nov. 11, 2010 for "Wafer Level Semiconductor Package and Manufacturing Methods Thereof."

Chen et al., U.S. Appl. No. 12/874,144, filed Sep. 1, 2010 for "Stackable Semiconductor Package and Manufacturing Method Thereof."

\* cited by examiner

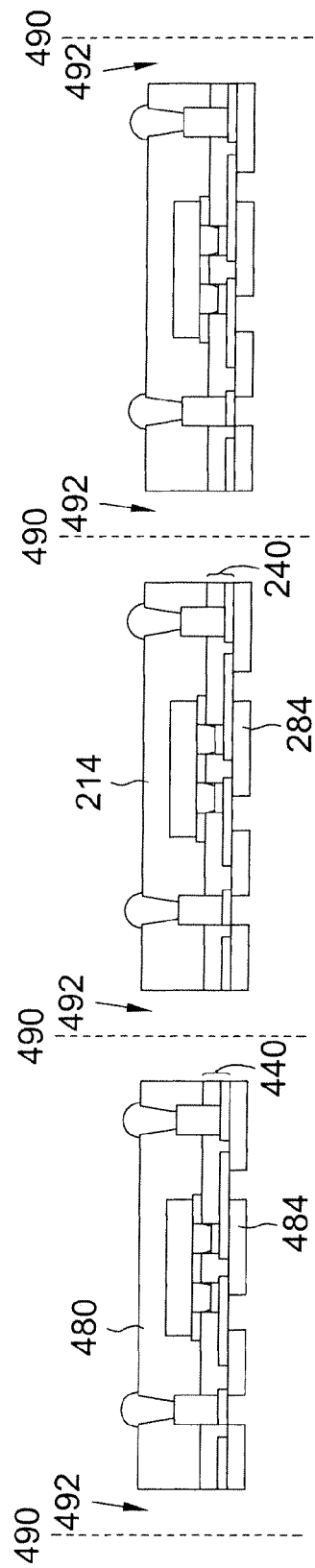
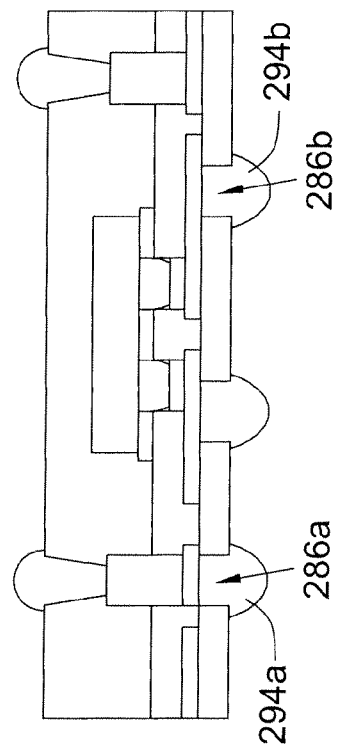
FIG. 4R
FIG. 4S

SEMICONDUCTOR DEVICE PACKAGES WITH FAN-OUT AND WITH CONNECTING ELEMENTS FOR STACKING AND MANUFACTURING METHODS THEREOF

FIELD OF THE INVENTION

The invention relates generally to semiconductor device packages and manufacturing methods thereof. More particularly, the invention relates to semiconductor device packages with metal pillars and via holes and manufacturing methods thereof.

BACKGROUND

Electronic products have become progressively more complex, driven at least in part by the demand for enhanced functionality and smaller sizes. While the benefits of enhanced functionality and smaller sizes are apparent, achieving these benefits also can create problems. In particular, electronic products typically have to accommodate a high density of semiconductor devices in a limited space. For example, the space available for processors, memory devices, and other active or passive devices can be rather limited in cell phones, personal digital assistants, laptop computers, and other portable consumer products. In conjunction, semiconductor devices are typically packaged in a fashion to provide protection against environmental conditions as well as to provide input and output electrical connections. Packaging of semiconductor devices within semiconductor device packages can take up additional valuable space within electronic products. As such, there is a strong drive towards reducing footprint areas taken up by semiconductor device packages. One approach along this regard is to stack semiconductor device packages on top of one another to form a stacked package assembly. Unfortunately, conventional wafer-level packaging can be inadequate in terms of stacking functionality.

In addition, in conventional wafer-level packaging, semiconductor devices within a wafer are packaged prior to singulation of the wafer. As such, conventional wafer-level packaging can be restricted to a fan-in configuration, namely electrical contacts and other components of a resulting semiconductor device package are restricted to an area defined by a periphery of a semiconductor device. Any component disposed outside of the periphery of the semiconductor device typically is not supported and typically is removed upon singulation. The restriction of a fan-in configuration presents challenges as device sizes continue to shrink.

It is against this background that a need arose to develop the semiconductor device package and related methods described herein.

SUMMARY

One aspect of the invention relates to a semiconductor device package. In one embodiment, the semiconductor device package includes: (1) an interconnection unit including an upper surface and a first patterned conductive layer extending substantially laterally within the interconnection unit; (2) an electrical interconnect extending substantially vertically from the first patterned conductive layer, and including: (a) an upper surface; and (b) a lower surface adjacent to an upper surface of the first patterned conductive layer; (3) a first semiconductor device disposed adjacent to the upper surface of the interconnection unit and electrically connected to the first patterned conductive layer; (4) a package body disposed substantially covering the upper surface of the interconnection unit and the first semiconductor device, the package body defining a first opening disposed adjacent to an upper surface of the package body and exposing the upper surface of the electrical interconnect; and (5) a connecting element electrically connected to the first semiconductor device and substantially filling the first opening, the connecting element being exposed at an external periphery of the semiconductor device package. The upper surface of the electrical interconnect defines a first plane above a second plane defined by at least a portion of the upper surface of the interconnection unit, and below a third plane defined by the upper surface of the package body.

Another aspect of the invention relates to a stacked device assembly. In one embodiment, the stacked device assembly includes: (1) a semiconductor device package including: (a) an interconnection unit including an upper surface; (b) a first semiconductor device disposed adjacent to the upper surface of the interconnection unit and electrically connected to the interconnection unit; and (c) a package body disposed adjacent to the upper surface of the interconnection unit and substantially covering the first semiconductor device, the package body including an upper surface and defining an opening disposed adjacent to the upper surface of the package body; (2) a second semiconductor device disposed adjacent to the upper surface of the package body; and (3) a stacking element extending through the opening in the package body and electrically connecting the first semiconductor device and the second semiconductor device, the stacking element including: (a) an electrical interconnect including an upper surface and extending substantially vertically from the interconnection unit; and (b) a fused conductive bump electrically connected to the first semiconductor device via at least the electrical interconnect and substantially filling the opening, the fused conductive bump being exposed at an external periphery of the stacked device assembly. The upper surface of the electrical interconnect defines a first plane above a second plane defined by at least a portion of the upper surface of the interconnection unit, and below a third plane defined by the upper surface of the package body.

Another aspect of the invention relates to a method of forming a semiconductor device package. The method of forming a semiconductor device package includes: (1) providing a first semiconductor device; (2) forming an interconnection structure including: (a) an upper surface; (b) a lower surface; and (c) a patterned conductive layer extending substantially laterally within the interconnection structure; (3) forming an electrical interconnect including an upper surface and a lower surface adjacent to an upper surface of the patterned conductive layer, where the electrical interconnect extends substantially vertically from the patterned conductive layer; (4) disposing the first semiconductor device adjacent to the upper surface of the interconnection structure such that the first semiconductor device is electrically connected to the patterned conductive layer; (5) applying a molding material to form a molded structure substantially covering the upper surface of the electrical interconnect and the first semiconductor device; (6) forming a first opening in the molded structure, the first opening being adjacent to an upper surface of the molded structure and exposing the upper surface of the electrical interconnect, where a first distance from the upper surface of the electrical interconnect to the lower surface of the electrical interconnect is greater than a second distance from the upper surface of the interconnection structure to the lower surface of the interconnection structure; and (7) forming a first connecting element electrically connected to the electrical interconnect and substantially filling the first opening.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

DETAILED DESCRIPTION

Definitions

Figure 1:
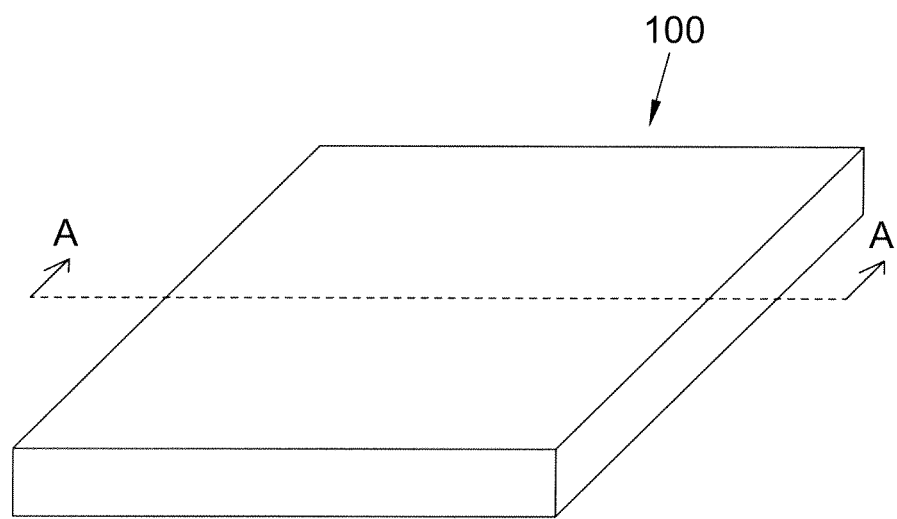
FIG. 1 illustrates a perspective view of semiconductor device package, according to an embodiment of the invention.

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an electrical interconnect can include multiple electrical interconnects unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another, such as in accordance with the drawings, but do not require a particular orientation of those components during manufacturing or use.

As used herein, the terms "connect," "connected," and "connection" refer to an operational coupling or linking. Connected components can be directly coupled to one another or can be indirectly coupled to one another, such as through another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

DESCRIPTION OF EMBODIMENTS OF THE INVENTION

Figure 2:
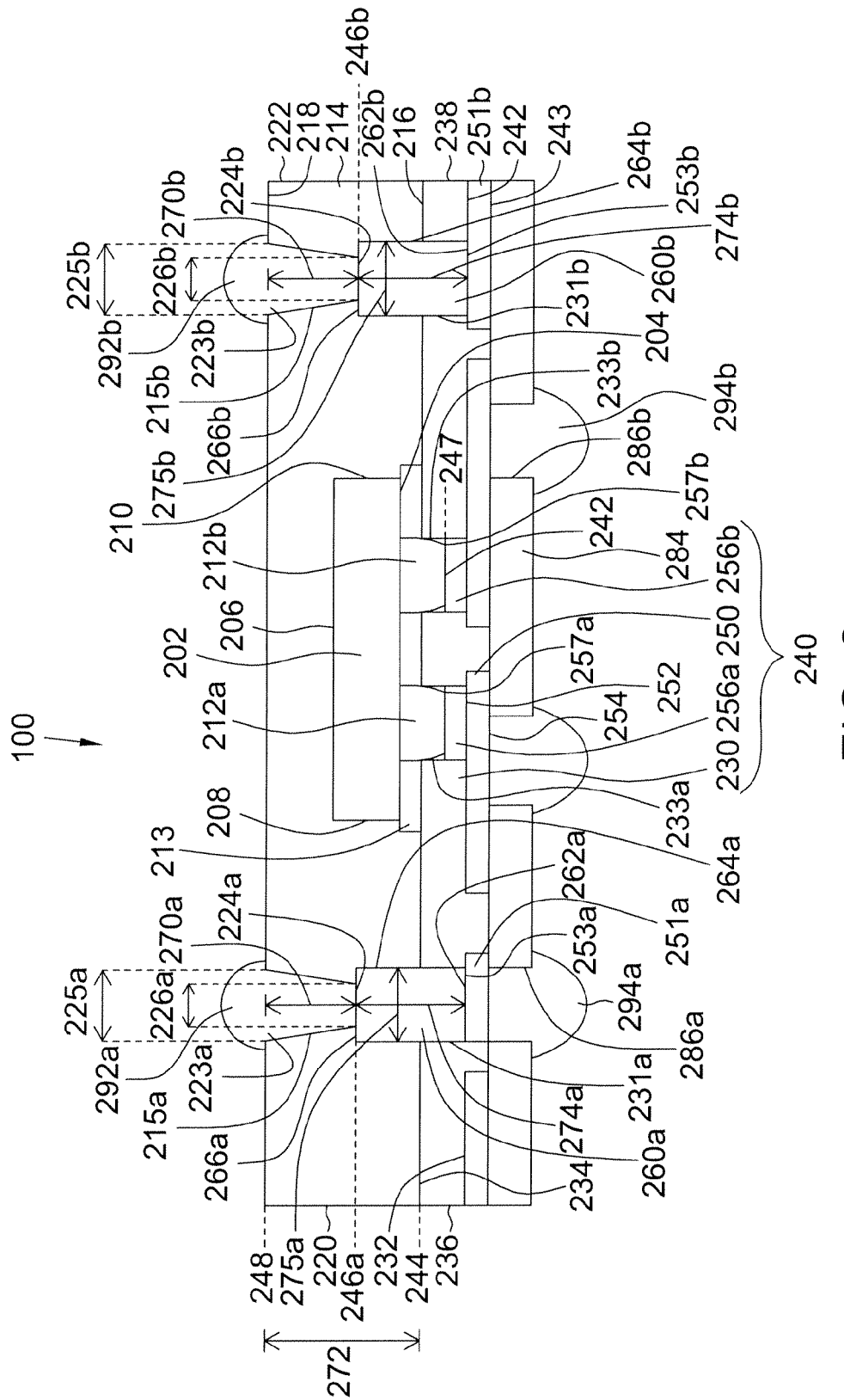
FIG. 2 illustrates a cross-sectional view of the package of FIG. 1, taken along line A-A of FIG. 1, according to an embodiment of the invention.

Attention first turns to FIG. 1 and FIG. 2, which illustrate a semiconductor device package 100 implemented in accordance with an embodiment of the invention. In particular, FIG. 1 illustrates a perspective view of the package 100, while FIG. 2 illustrates a cross-sectional view of the package 100, taken along line A-A of FIG. 1.

In the illustrated embodiment, sides of the package 100 are substantially planar and have a substantially orthogonal orientation so as to define a lateral profile that extends around substantially an entire periphery of the package 100. Advantageously, this orthogonal lateral profile allows a reduced overall package size by reducing or minimizing a footprint area of the package 100. However, it is contemplated that the lateral profile of the package 100, in general, can be any of a number of shapes, such as curved, inclined, stepped, or roughly textured.

Referring to FIG. 2, the semiconductor device package 100 includes a semiconductor device 202, which includes a lower surface 204, an upper surface 206, and lateral surfaces 208 and 210 disposed adjacent to a periphery of the semiconductor device 202 and extending between the lower surface 204 and the upper surface 206. In the illustrated embodiment, each of the surfaces 204, 206, 208, and 210 is substantially planar, with the lateral surfaces 208 and 210 having a substantially orthogonal orientation with respect to the lower surface 204 or the upper surface 206, although it is contemplated that the shapes and orientations of the surfaces 204, 206, 208, and 210 can vary for other implementations. As illustrated in FIG. 2, the upper surface 206 is a back surface of the semiconductor device 202, while the lower surface 204 is an active surface of the semiconductor device 202. In one embodiment, connectors 212a and 212b are disposed adjacent to the lower surface 204. These connectors 212 provide input and output electrical connections for the semiconductor device 202 to conductive structures included in the package 100, such as a patterned conductive layer 250 (described below). In one embodiment, the connectors 212 may be solder bumps. In one embodiment, an underfill layer 213 may optionally be added between the lower surface 204 and an interconnection unit 240 (described below). The underfill layer 213 may include epoxy, resin, or other suitable materials. In the illustrated embodiment, the semiconductor device 202 is a semiconductor chip, although it is contemplated that the semiconductor device 202, in general, can be any active device, any passive device, or a combination thereof. While one semiconductor device is illustrated in FIG. 2, it is contemplated that additional semiconductor devices can be included for other implementations.

As illustrated in FIG. 2, the semiconductor device package 100 also includes a package body 214 that is disposed adjacent to the semiconductor device 202. In the illustrated embodiment, the package body 214 substantially covers or encapsulates the semiconductor device 202 in conjunction with the underfill layer 213 and an upper surface 242 of the interconnection unit 240 (described below) to provide mechanical stability as well as protection against oxidation, humidity, and other environmental conditions. In this embodiment, the package body 214 substantially covers the upper surface 206 and the lateral surfaces 208 and 210 of the semiconductor device 202, with the lower surface 204 the semiconductor device 202 being substantially exposed or uncovered by the package body 214. However, it is contemplated that the extent of coverage by the package body 214 can be varied from that illustrated in FIG. 2. For example, it is contemplated that the package body 214 can substantially cover the lateral surfaces 208 and 210, while both the lower surface 204 and the upper surface 206 are substantially uncovered.

As illustrated in FIG. 2, the package body 214 includes a lower surface 216, an upper surface 218, and lateral surfaces 220 and 222 disposed adjacent to a periphery of the package body 214 and extending between the lower surface 216 and the upper surface 218. In the illustrated embodiment, each of the surfaces 216, 218, 220, and 222 is substantially planar, with the lateral surfaces 220 and 222 having a substantially orthogonal orientation with respect to the lower surface 216 and the upper surface 218, although it is contemplated that the shapes and orientations of the surfaces 216, 218, 220, and 222 can vary for other implementations.

In one embodiment, the package body 214 can be formed from a molding material. The molding material can include, for example, a Novolac-based resin, an epoxy-based resin, a silicone-based resin, or another suitable encapsulant. Suitable fillers can also be included, such as powdered $SiO_2$. The molding material may be a pre-impregnated (prepreg) material, such as a pre-impregnated dielectric material. It is also contemplated that the package body 214 can include a supporting structure in conjunction with, or in place of, a molding material. For example, the package body 214 can include a frame or an interposer, which can be formed from glass, silicon, a metal, a metal alloy, a polymer, or another suitable structural material.

As illustrated in FIG. 2, a layer 230 includes a lower surface 232, an upper surface 234, and lateral surfaces 236 and 238 disposed adjacent to a periphery of the layer 230 and extending between the lower surface 232 and the upper surface 234. In the illustrated embodiment, each of the surfaces 234, 236, and 238 is substantially planar, with the lateral surfaces 236 and 238 having a substantially orthogonal orientation with respect to the upper surface 234, although it is contemplated that the shapes and orientations of the surfaces 234, 236, and 238 can vary for other implementations. The lower surface 232 is shown as extending into openings in the patterned conductive layer 250 (described below), although it is contemplated that the shape and orientation of the lower surface 232 can vary for other implementations. For example, the lower surface 232 may be substantially planar. The upper surface 234 may be adjacent to the lower surface 216 of the package body 214.

In one embodiment, the layer 230 can be formed from a dielectric material that is polymeric or non-polymeric. For example, the layer 230 can be formed from polyimide, polybenzoxazole, benzocyclobutene, or a combination thereof. For certain implementations, the layer 230 can be formed from a dielectric material that is photoimageable or photoactive. In another embodiment, the layer 230 can be formed from solder mask (solder resist), such as dry film imageable solder mask, or another type of patternable layer or dielectric layer. In one embodiment, a thickness of the layer 230 may be in the range 10 microns to 30 microns, such as a range of 10 microns to 20 microns, or a range of 20 microns to 30 microns. While one layer 230 is illustrated in FIG. 2 as part of the package 100, it is contemplated that more or less layers of similar composition and characteristics to the layer 230 can be included in a semiconductor device package in other embodiments.

As illustrated in FIG. 2, the semiconductor device package 100 further includes the patterned conductive layer 250 adjacent to the lower surface 232 of the layer 230. The patterned conductive layer 250 has an upper surface 252 and a lower surface 254. The patterned conductive layer 250 may include electrical interconnects 251a and 251b. The electrical interconnects 251a and 251b may extend substantially laterally within the patterned conductive layer 250. The electrical interconnects 251a and 251b have first surfaces 253a and 253b, respectively, that may be included in the upper surface 252 of the patterned conductive layer 250. The package 100 further includes electrical interconnects 260a and 260b.

The electrical interconnect 251a may electrically connect the electrical interconnect 260a to an electrical contact 294a or another electrical interconnect (not shown). In one embodiment, the electrical interconnect 251a may be adjacent to the electrical contact 294a or the another electrical interconnect at an opening 286a in a protection layer 284 adjacent to the patterned conductive layer 250. The electrical interconnect 251b may electrically connect the electrical interconnect 260b to an electrical contact 294b or another electrical interconnect (not shown). In one embodiment, the electrical interconnect 251b may be adjacent to the electrical contact or the another electrical interconnect at an opening 286b in the protection layer 284.

The electrical interconnects 260a and 260b have lower surfaces 262a and 262b, lateral surfaces 264a and 264b, and upper surfaces 266a and 266b, respectively. The electrical interconnects 260a and 260b are positioned around the semiconductor device 202, and may extend substantially vertically from the first surfaces 253a and 253b, respectively. The lower surfaces 262a and 262b may be adjacent to the first surfaces 253a and 253b, respectively. At least a portion of the first surfaces 253a and 253b may be substantially covered by the layer 230. At least a portion of the lateral surfaces 264a and 264b may be substantially covered by the package body 214. At least a portion of the lateral surfaces 264a and 264b may be substantially covered by the layer 230.

As illustrated in FIG. 2, the layer 230 may be formed so as to define openings 233a and 233b, which are aligned and sized so as to accommodate the connectors 212a and 212b, respectively. The connectors 212a and 212b may be adjacent to the upper surface 252 of the patterned conductive layer 250. Alternatively, the connectors 212a and 212b may be adjacent to plating layers 256a and 256b (or finish layers 256a and 256b), respectively. The plating layers 256a and 256b may be disposed adjacent to the upper surface 252 of the patterned conductive layer 250, and may be disposed in the openings 233a and 233b, respectively.

The patterned conductive layer 250 may be included in the interconnection unit 240. In addition, the plating layers 256a and 256b and the layer 230 may optionally be included in the interconnection unit 240. The patterned conductive layer 250 may extend substantially laterally within the interconnection unit 240. The upper surface 252 of the patterned conductive layer 250 may be included in the upper surface 242 of the interconnection unit 240. In addition, the upper surfaces 257a and 257b of the plating layers 256a and 256b, respectively, and the upper surface 234 of the layer 230 may be included in the upper surface 242 of the interconnection unit 240. The interconnection unit 240 also includes a lower surface 243. The lower surface 254 of the patterned conductive layer 250 may be included in the lower surface 243. In addition, portions of the lower surface 232 of the layer 230 may be included in the lower surface 243.

As illustrated in FIG. 2, the package body 214 is formed so as to define openings 215a and 215b. The layer 230 is formed so as to define openings 231a and 231b, where the openings 231a and 231b may be substantially aligned with the openings 215a and 215b, respectively. The openings 215a and 215b may extend from the upper surface 218 to the upper surfaces 266a and 266b of the electrical interconnects 260a and 260b, respectively, and may expose the upper surfaces 266a and 266b. The openings 231a and 231b may extend from the upper surface 234 to the lower surface 232 of the layer 230, and may be disposed adjacent to the upper surface 252 of the patterned conductive layer 250. The upper surface 266a of the electrical interconnect 260a may define a plane 246a above a plane 247 defined by at least a portion of the upper surface 242 of the interconnection unit 240 (such as at least one of the upper surfaces 257a and 257b of the plating layers 256a and 256b, respectively), and below a plane 248 defined by the upper surface 218 of the package body 214. Similarly, the upper surface 266b of the electrical interconnect 260b may define a plane 246b above the plane 247, and below the plane 248. In one embodiment, the electrical interconnect 260a may substantially fill the opening 231a, and/or the electrical interconnect 260b may substantially fill the opening 231b, such that at least one of the planes 246a and 246b is above a plane 244 defined by the upper surface 234 of the layer 230. Alternatively, at least one of the planes 246a and 246b, respectively, may be above the plane 247, and below the plane 248.

As illustrated in FIG. 2, connecting elements 292a and 292b are exposed at an external periphery of the semiconductor device package 100. The connecting elements 292a and 292b provide input and output electrical connections for the package 100, and at least one of the connecting elements 292a and 292b is electrically connected to the semiconductor device 202 through at least one of the electrical interconnects 260 and the patterned conductive layer 250. In the illustrated embodiment, the connecting elements 292a and 292b are conductive bumps, such as solder bumps. Alternatively, the connecting elements 292a and 292b may be fused conductive bumps, such as solder bumps that have been reflowed and combined with other conductive elements, such as other solder bumps. The fused conductive bumps may be formed to provide electrical connectivity between the package 100 and another semiconductor device (shown in FIG. 3) and/or semiconductor device package stacked above the package 100. In one embodiment, the connecting elements 292a and 292b are physically accessible from outside the package 100. This physical accessibility of the connecting elements 292, for example, would enable reflowing of the connecting elements 292 as part of stacking of another semiconductor device and/or package on the package 100. The connecting elements 292 may be formed from solder paste, where the solder paste may include at least one of tin, copper, and various other suitable metals.

Advantageously, the openings 215a and 215b may be sized so that the connecting elements 292a and 292b may substantially fill the openings 215a and 215b, respectively, to minimize and/or prevent voids. The prevention of voids within the openings 215a and 215b is desirable to enhance the electrical connectivity characteristics of the electrical interconnects 260 and the connecting elements 292, and therefore between the package 100 and another semiconductor device (shown in FIG. 3) and/or semiconductor device package stacked above the package 100. A further advantage of controlling the sizing of the openings 215a and 215b is to facilitate control of the volume of conductive material forming the connecting elements 292a and 292b. In one embodiment, voids can be minimized and/or prevented within the openings 215a and 215b by sizing the electrical interconnects 260a and 260b so that the planes 246a and 246b are above the plane 247, and therefore so that heights 270a and 270b of the openings 215a and 215b are controlled. In one embodiment, it may be desirable for heights 270a and 270b of the openings 215a and 215b, respectively, to be 400 microns or less to minimize and/or prevent voids within the openings 215a and 215b. For example, a height 272 of the package body 214 may be in the range 200 microns to 500 microns, such as a range of 200 microns to 300 microns, a range of 300 microns to 400 microns, or a range of 400 microns to 500 microns. In this example, heights 274a and 274b of the electrical interconnects 260a and 260b, respectively, may be sufficiently large (such as greater than 100 microns) so that the heights 270a and 270b of the openings 215a and 215b are 400 microns or less. The heights 270a and 270b may be greater, the same, or smaller than the heights 274a and 274b.

In one embodiment, the connecting elements 292a and 292b may protrude beyond the upper surface 218 of the package body 214. This protrusion of the connecting elements 292a and 292b may increase the contact area of the connecting elements 292a and 292b that is exposed, which may enable a stronger physical join and better electrical connectivity between the package 100 and another semiconductor device (shown in FIG. 3) and/or semiconductor device package stacked above the package 100. Alternatively, the connecting elements 292a and 292b may not extend beyond the upper surface 218 of the package body 214. For example, the connecting elements 292a and 292b may extend to, but not beyond, the upper surface 218 such that the openings 215a and 215b are substantially filled.

In one embodiment, portions 224a and 224b of the openings 215a and 215b are adjacent to the upper surfaces 266a and 266b of the electrical interconnects 260a and 260b, respectively. Width 226a of the portion 224a may be less than width 275a of the upper surface 266a, and width 226b of the portion 224b may be less than width 275b of the upper surface 266b.

In one embodiment, portions 223a and 223b of the openings 215a and 215b are adjacent to the plane 248 defined by the upper surface 218 of the package body 214. Width 225a of the portion 223a may be greater than the width 226a of the portion 224a, and width 225b of the portion 223b may be greater than the width 226b of the portion 224b.

Advantageously, the patterned conductive layer 250 may serve as a redistribution network for the semiconductor device 202. In one embodiment, the semiconductor device package 100 may provide a fan-out configuration in which the patterned conductive layer 250 extends substantially laterally outside of the periphery of the semiconductor device 202. For example, FIG. 2 shows the electrical interconnects 251a and 251b outside of the periphery of the semiconductor device 202. The electrical interconnects 251a and 251b may be electrically connected to the semiconductor device 202 via other electrical interconnects in the patterned conductive layer 250 (not shown). The fan-out configuration of the package 100 allows greater flexibility in terms of the arrangement and spacing of the electrical contacts 294a and 294b, with reduced dependence upon the arrangement and spacing of contact pads the semiconductor device 202. The electrical interconnects 260a and 260b and the connecting elements 292a and 292b can facilitate extending this to a three-dimensional fan-out (see FIG. 3) by providing electrical pathways from the semiconductor device 202 to the upper surface of the package 100.

The electrical contacts 294a and 294b provide input and output electrical connections for the package 100, and at least one of the electrical contacts 294a and 294b is electrically connected to the semiconductor device 202 through the electrically conductive layer 250. In the illustrated embodiment, the electrical contacts 294a and 294b are conductive bumps, such as solder bumps. Alternatively, the electrical contacts 294a and 294b may be fused conductive bumps, such as solder bumps that have been reflowed and combined with other conductive elements, such as other solder bumps.

In accordance with the fan-out configuration of the package 100, the connecting elements 292a and 292b and the electrical contacts 294a and 294b are laterally disposed outside of the periphery of the semiconductor device 202, although it is contemplated that the electrical contacts 294a and 294b, in general, can be laterally disposed within that periphery, outside of that periphery, or both. In such manner, the fan-out configuration of the package 100 allows greater flexibility in terms of the arrangement and spacing of the electrical contacts 294a and 294b, with reduced dependence upon the arrangement and spacing of the contact pads of the semiconductor device 202.

In general, the patterned conductive layer 250 and each of the electrical interconnects 260a and 260b can be formed from a metal, a metal alloy, a matrix with a metal or a metal alloy dispersed therein, or another suitable electrically conductive material. For example, at least one of the patterned conductive layer 250 and the electrical interconnects 260a and 260b can be formed from aluminum, copper, titanium, or a combination thereof. The patterned conductive layer 250 and the electrical interconnects 260a and 260b can be formed from the same electrically conductive material or different electrically conductive materials.

The plating layers 256a and 256b can be formed similarly to the patterned conductive layer 250, as described previously. Alternatively, the plating layers 256a and 256b may be formed differently. For example, the plating layers 256a and 256b may be formed from at least one of tin, nickel, and gold, or an alloy including tin or including nickel and gold. The plating layers 256a and 256b can be formed from the same electrically conductive material or different electrically conductive materials.

The protection layer 284 can be formed similarly to the layer 230, as described previously. The protection layer 284 may be formed using solder mask (solder resist), such as dry film imageable solder mask, or another type of patternable layer or dielectric layer. While one protection layer 284 is illustrated in FIG. 2, it is contemplated that more or less protection layers can be included for other implementations. Openings in the protection layer 284, such as the openings 286a and 286b, may expose portions of the electrically conductive layer 250, such as portions of at least one of the electrical interconnects 251a and 251b. The openings 286a and 286b may be substantially aligned with at least one of the lower surfaces 262a and 262b of the electrical interconnects 260a and 260b, respectively. The protection layer 284 may be patterned to form the openings 286. The openings 286 can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

Figure 3:
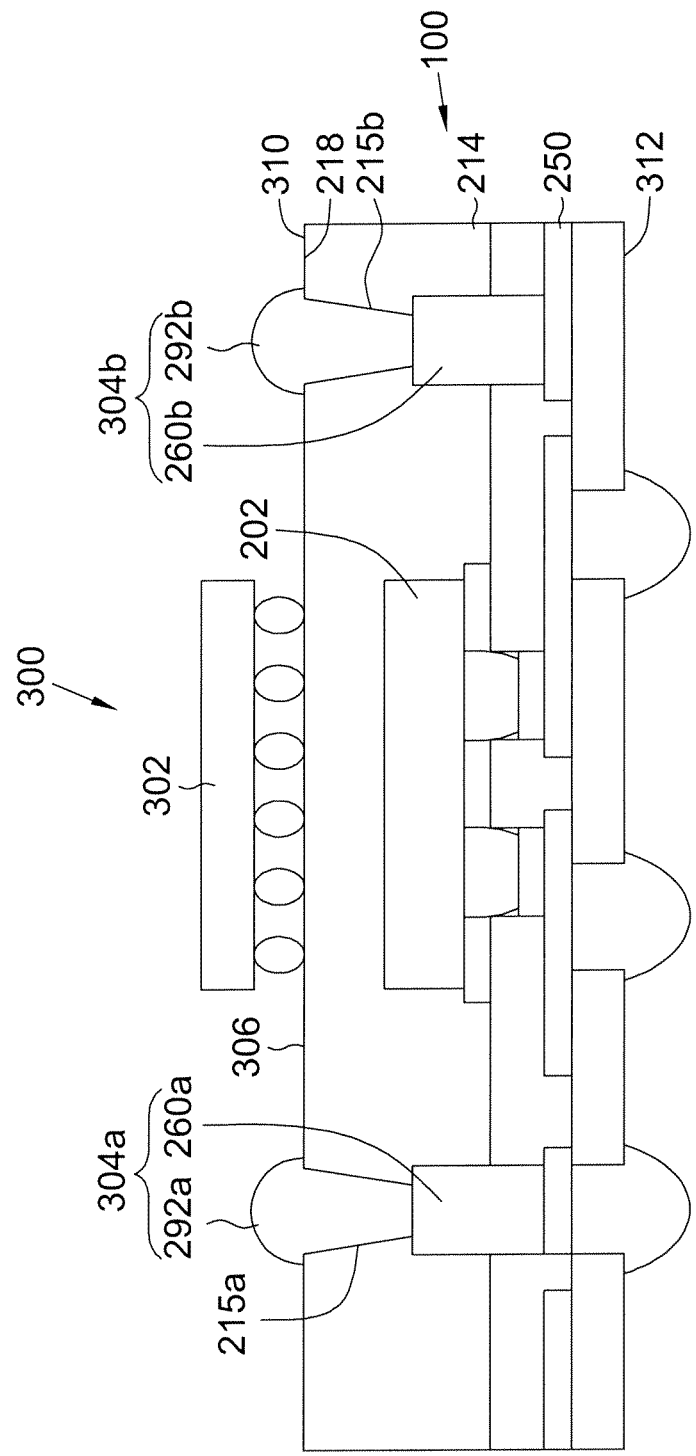
FIG. 3 illustrates a cross-sectional view of a stacked device assembly, according to an embodiment of the invention.

Attention next turns to FIG. 3, which illustrates a cross-sectional view of a stacked device assembly 300, according to an embodiment of the invention. In this embodiment, the stacked device assembly 300 includes a semiconductor device 302 stacked on the package 100. The semiconductor device 302 may be unpackaged. Alternatively, the stacked device assembly may include another semiconductor device package (not shown) stacked on the package 100. The another semiconductor device package may be similar to the package 100, may include a patterned conductive layer similar to the patterned conductive layer 250, and may include a semiconductor device similar to the semiconductor device 202. The semiconductor device 302 and/or the another semiconductor device package may be disposed adjacent to or above the upper surface 218 of the package body 214. While the stacked device assembly 300 is illustrated in FIG. 3 as including a two-layer stack, it is contemplated that the stack may include more than two layers for other implementations.

As illustrated in FIG. 3, the stacked device assembly 300 may include stacking elements 304a and 304b, at least one of which electrically connects the semiconductor device 202 and the semiconductor device 302 through the patterned conductive layer 250 and a patterned conductive layer 306. The stacking element 304a includes the electrical interconnect 260a and the connecting element 292a, and the stacking element 304b includes the electrical interconnect 260b and the connecting element 292b. The stacking element 304a may extend through and substantially fill the opening 215a in the package body 214, and the stacking element 304b may extend through and substantially fill the opening 215b in the package body 214. In this embodiment, the connecting elements 292a and 292b are in the form of fused conductive bumps exposed at an external periphery of the stacked device assembly 300. As described previously, the connecting elements 292 may be physically accessible from outside the package 100.

In one embodiment, the connecting elements 292a and 292b may be fused to the patterned conductive layer 306 to form fused conductive bumps exposed at an external periphery of the stacked device assembly 300. The patterned conductive layer 306 may be disposed adjacent to the upper surface of the package body 214. Alternatively, the connecting elements 292a and 292b may be fused to electrical contacts (similar to electrical contacts 294a and 294b) of the another semiconductor package stacked on the package 100, where the electrical contacts are electrically connected to a patterned conductive layer (similar to the patterned conductive layer 250) in the another semiconductor device package.

As illustrated in FIG. 3, the stacked device assembly 300 may include the patterned conductive layer 306, which may serve as a redistribution network for the semiconductor device 302. In one embodiment, the stacked device assembly 300 may provide a fan-out configuration in which the patterned conductive layer 306 is electrically connected to the semiconductor device 302 and extends substantially laterally outside of the periphery of the semiconductor device 302. As described previously, the electrical interconnects 260a and 260b and the connecting elements 292a and 292b of the package 100 can facilitate extending a two-dimensional fan-out to a three-dimensional fan-out by providing electrical pathways from the semiconductor device 202 to the upper surface of the package 100. A three-dimensional fan-out configuration can be created by electrically connecting the connecting elements 292a and 292b to the patterned conductive layer 306. This three-dimensional fan-out configuration can advantageously increase flexibility beyond that provided by two-dimensional fan-out in terms of the arrangement and spacing of electrical contacts on both an upper side 310 and a lower side 312 of the stacked device assembly 300.

Figure 4A:
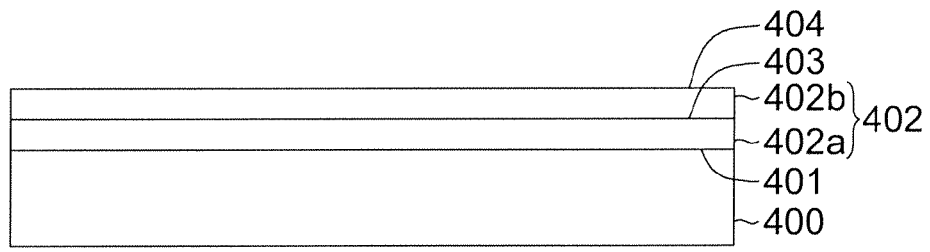
FIG. 4A through FIG. 4S illustrate a method of forming the semiconductor device package of FIG. 2, according to an embodiment of the invention.

FIG. 4A through FIG. 4S illustrate a method of forming the semiconductor device package 100 of FIG. 2, according to an embodiment of the invention. For ease of presentation, the following manufacturing operations are described with reference to the package 100 of FIG. 2. However, it is contemplated that the manufacturing operations can be similarly carried out to form other semiconductor device packages that may have different internal structure from the package 100.

Referring first to FIG. 4A, a carrier 400 is provided, and an electrically conductive layer 402 is disposed adjacent to an upper surface 401 of the carrier 400. The electrically conductive layer 402 has an upper surface 404, and may include multiple sub-layers 402a and 402b. The sub-layer 402a may be formed from a metal, a metal alloy, a matrix with a metal or a metal alloy dispersed therein, or another suitable electrically conductive material. For example, the sub-layer 402a may include a metallic foil formed from copper or an alloy including copper. The sub-layer 402a may be attached to the carrier 400 with a tape (not shown) disposed adjacent to the upper surface 401 of the carrier 400. The tape, which can be implemented as a single-sided or double-sided adhesive tape, secures components at an appropriate spacing with respect to one another, and allows subsequent manufacturing operations to be carried out with those components disposed adjacent to the carrier 400.

As illustrated in FIG. 4A, the sub-layer 402b may be applied to an upper surface 403 of the sub-layer 402a. The sub-layer 402b may be applied using any of a number of coating techniques, such as chemical vapor deposition, electroless plating, electrolytic plating, printing, spinning, spraying, sputtering, or vacuum deposition. The sub-layer 402b may be formed from a metal, a metal alloy, a matrix with a metal or a metal alloy dispersed therein, or another suitable electrically conductive material. The sub-layer 402b may be formed of an electrically conductive material different from that used to form the sub-layer 402a. For example, the sub-layer 402b may serve as an etch stop layer, and may include nickel or an alloy including nickel.

Figure 4B:
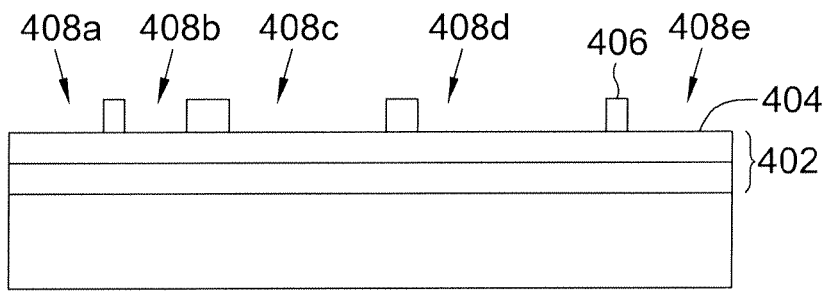

Next, as illustrated in FIG. 4B, a photoresist material may be applied to the upper surface 404 of the electrically conductive layer 402 to form a photoresist layer 406 adjacent to the upper surface 404. The photoresist material may be a dry film photoresist, or another type of patternable layer or dielectric layer. The photoresist layer 406 may be formed by coating, printing, or any other suitable technique. Predetermined or selected portions of the photoresist layer 406 may be photoimaged and developed so as to create openings, including openings 408a-408e, exposing the upper surface 404 of the electrically conductive layer 402. The photoresist layer 406 may be photochemically defined using a photomask (not shown). Photoimaging and developing may have advantages of lower cost and decreased process time as compared to other approaches for creating openings in the photoresist layer 406. The resulting openings can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

Figure 4C:
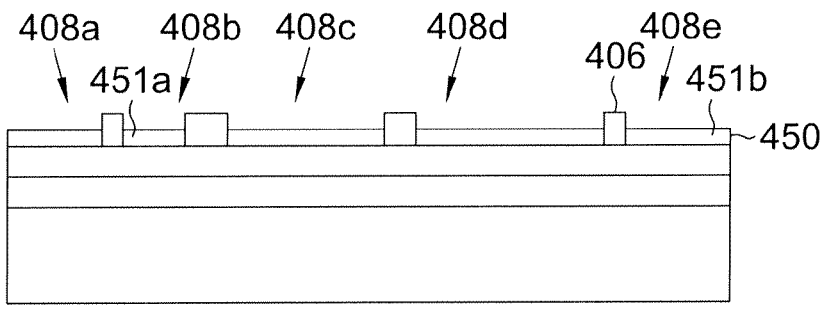

Next, as illustrated in FIG. 4C, an electrically conductive material is applied into the openings, including openings 408a-408e, defined by the photoresist layer 406 to form an electrically conductive layer 450, including electrical interconnects 451a and 451b. The electrically conductive layer 450 and the electrical interconnects 451a and 451b may extend substantially laterally, and may be formed using the same types of materials as previously described for the electrically conductive layer 250 and the electrical interconnects 251a and 251b (shown in FIG. 2). The patterned conductive layer 450 may be formed using any of a number of coating techniques, such as chemical vapor deposition, electroless plating, electrolytic plating, printing, spinning, spraying, sputtering, or vacuum deposition.

Figure 4D:
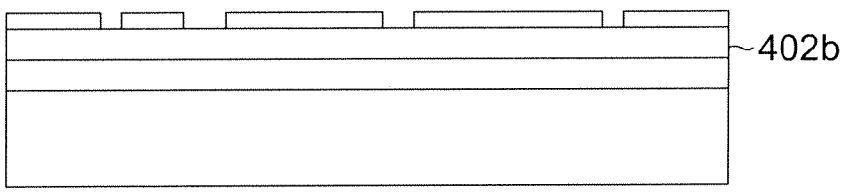

Next, as illustrated in FIG. 4D, the photoresist layer 406 is stripped to expose portions of the sub-layer 402b.

Figure 4E:
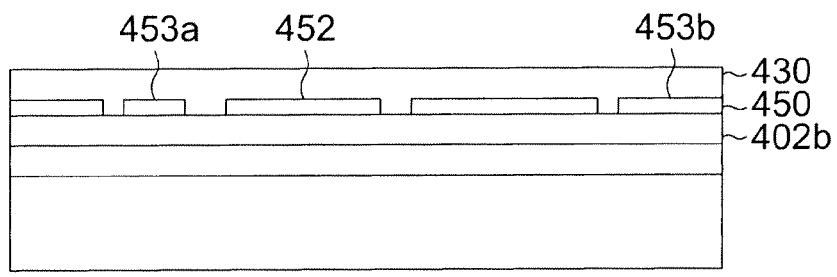

Next, as illustrated in FIG. 4E, a layer 430 is formed adjacent to the patterned conductive layer 450 and the exposed portions of the sub-layer 402b. The layer 430 may substantially cover an upper surface 452 of the patterned conductive layer 450, such that the patterned conductive layer 450 is embedded in the layer 430. A dielectric material may be applied using any of a number of coating techniques, such as printing, spinning, or spraying. In one embodiment, the layer 430 may be created by laminating a dielectric material on the upper surface 452 of the patterned conductive layer 450 (including first surfaces 453a and 453b, corresponding to first surfaces 253a and 253b in FIG. 2) and the exposed portions of the sub-layer 402b. Alternatively, the layer 430 may be created by spreading the dielectric material in liquid form on the upper surface 452 of the patterned conductive layer 450 (including the first surfaces 453a and 453b) and the exposed portions of the sub-layer 402b. Alternatively, the layer 430 can be formed from solder mask (solder resist), such as dry film imageable solder mask, or another type of patternable layer or dielectric layer. The layer 430 may be formed using the same types of materials as previously described for the layer 230 (shown in FIG. 2).

Figure 4F:
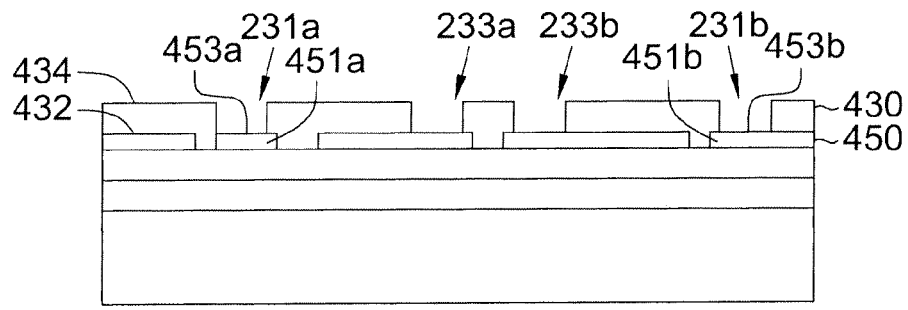

Next, as illustrated in FIG. 4F, the openings 231a and 231b are formed in the layer 430 to expose the first surfaces 453a and 453b of the electrical interconnects 451a and 451b, respectively. In addition, the openings 233a and 233b are formed in the layer 430 to expose additional portions of the upper surface 452 of the patterned conductive layer 450. In this way, the layer 430 is patterned to form the openings 231a, 231b, 233a, and 233b. The openings 231a, 231b, 233a, and 233b may extend from an upper surface 434 of the layer 430 to a lower surface 432 of the layer 430. Patterning to form the layer 430 can be carried out in any of a number of ways, such as photolithography, chemical etching, laser drilling, or mechanical drilling, and the resulting openings can have any of a number of shapes, such as a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

Figure 4G:
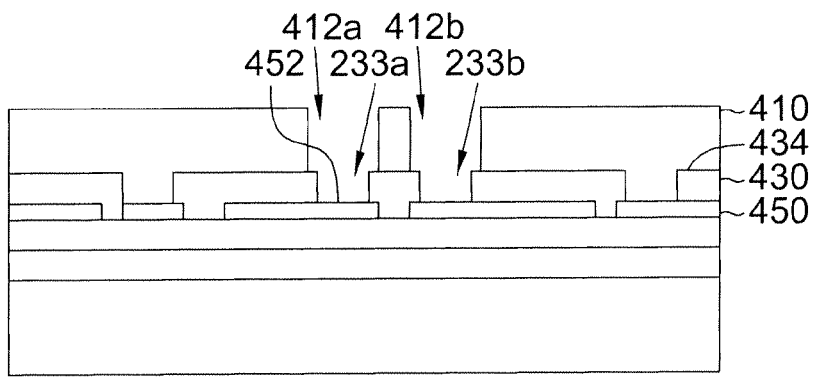

Next, as illustrated in FIG. 4G, a photoresist material may be applied to the upper surface 434 of the layer 430 to form a photoresist layer 410 adjacent to the upper surface 434. The photoresist material may be a dry film photoresist, or another type of patternable layer or dielectric layer. The photoresist layer 410 may be formed as described previously for FIG. 4B. Also as described previously for FIG. 4B, predetermined or selected portions of the photoresist layer 410 may be photoimaged and developed so as to create openings, including openings 412a and 412b. The openings 412a and 412b may be aligned with the openings 233a and 233b, respectively, to expose portions of the upper surface 452 of the patterned conductive layer 450. The openings 412a and 412b may have characteristics similar to those of the openings 408a-408e.

Figure 4H:
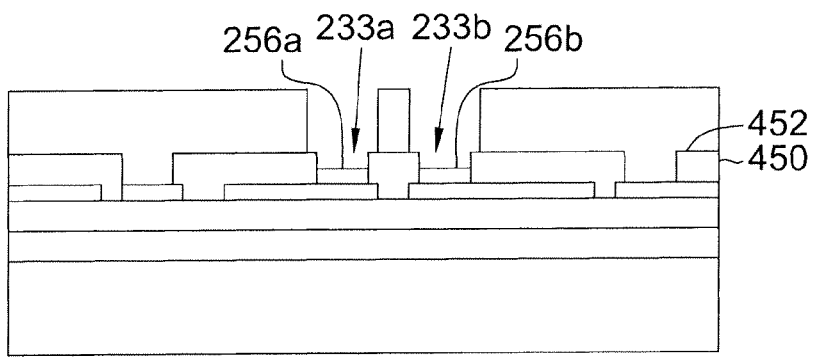

Next, as illustrated in FIG. 4H, an electrically conductive material is applied into the openings 233a and 233b that expose portions of the upper surface 452 of the patterned conductive layer 450. In this way, the plating layers 256a and 256b may be formed using any of the techniques described previously for FIG. 4C.

Figure 4I:
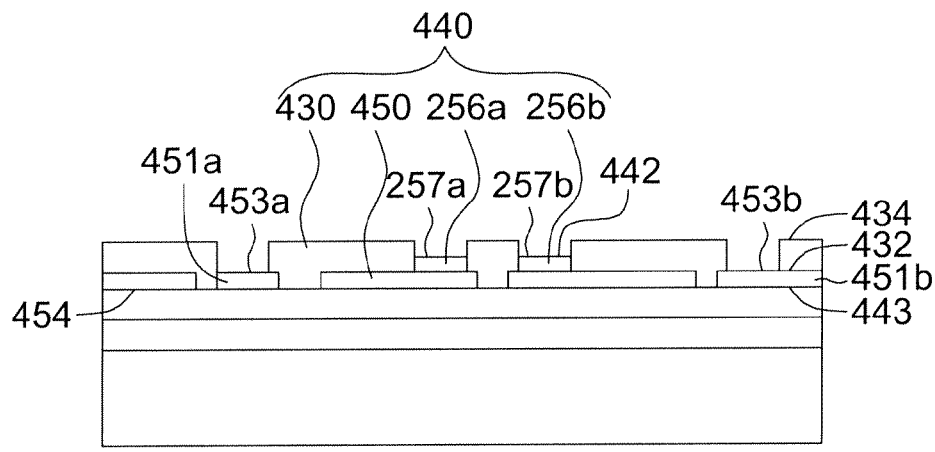

Next, as illustrated in FIG. 4I, the photoresist layer 410 is stripped to expose the upper surface 434 of the layer 430, and the first surfaces 453a and 453b of the electrical interconnects 451a and 451b, respectively. The stripping of the photoresist layer 410 exposes the interconnection structure 440, which by this point has been formed. In this embodiment, the interconnection structure 440 includes the layer 430, the patterned conductive layer 450, and the plating layers 256a and 256b. In other embodiments, the interconnection structure 440 (similar to the interconnection unit 240) may include the patterned conductive layer 450, and may optionally include the plating layers 256a and 256b without including the layer 430. As described previously, the upper surface 452 of the patterned conductive layer 450 may be included in an upper surface 442 of the interconnection structure 440. In addition, the upper surfaces 257a and 257b of the plating layers 256a and 256b, respectively, and the upper surface 434 of the layer 430 may be included in the upper surface 442 of the interconnection structure 440. The lower surface 454 of the patterned conductive layer 450 may be included in the lower surface 443 of the interconnection structure 440. In addition, portions of a lower surface 432 of the layer 430 may be included in the lower surface 443.

Figure 4J:
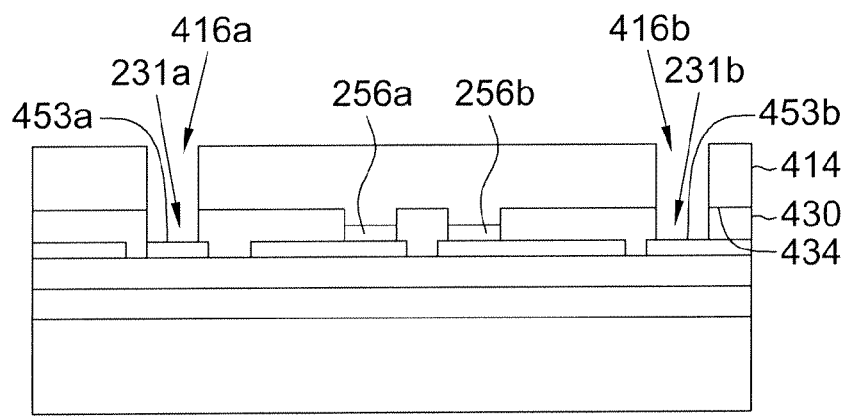

Next, as illustrated in FIG. 4J, a photoresist material may be applied to the upper surface 434 of the layer 430 and to the plating layers 256a and 256b to form a photoresist layer 414 adjacent to the upper surface 434 and to the plating layers 256a and 256b. The photoresist material may be a dry film photoresist, or another type of patternable layer or dielectric layer. The photoresist layer 414 may be formed as described previously for FIG. 4B. Also as described previously for FIG. 4B, predetermined or selected portions of the photoresist layer 414 may be photoimaged and developed so as to create openings, including openings 416a and 416b. The openings 416a and 416b may be aligned with the openings 231a and 231b, respectively, to expose the first surfaces 453a and 453b. The openings 416a and 416b may have characteristics similar to those of the openings 408a-408e.

Figure 4K:
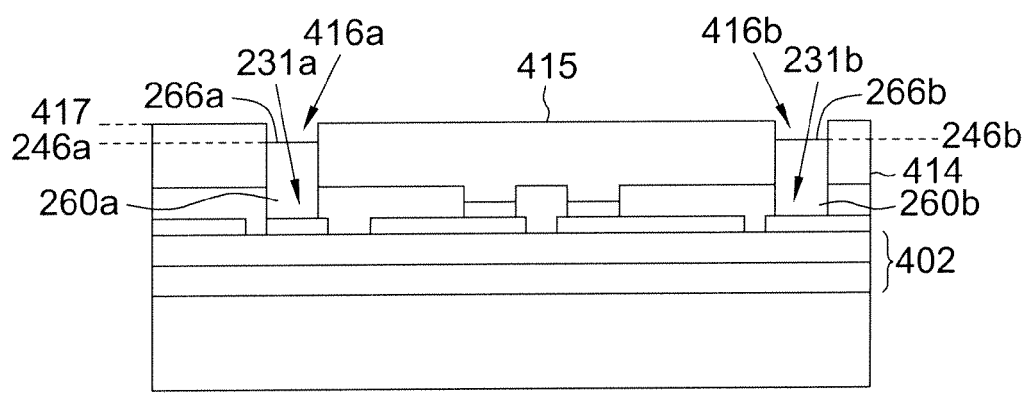

Next, as illustrated in FIG. 4K, an electrically conductive material is applied into the openings 416a and 416b defined by the photoresist layer 414, and into the openings 231a and 231b, to form electrical interconnects 260a and 260b, respectively. The electrical interconnects 260a and 260b may be formed extending substantially vertically away from the electrically conductive layer 402. The electrical interconnect 260a may substantially fill the openings 416a and 231a, and the electrical interconnect 260b may substantially fill the openings 416b and 231b. Alternatively, the planes 246a and 246b defined by the upper surfaces 266a and 266b of the electrical interconnects 260a and 260b, respectively, may be below a plane 417 defined by an upper surface 415 of the photoresist layer 414. The electrical interconnects 260a and 260b may be formed using any of a number of coating techniques, such as electrolytic plating or plugging a paste composed of the electrically conductive material.

Figure 4L:
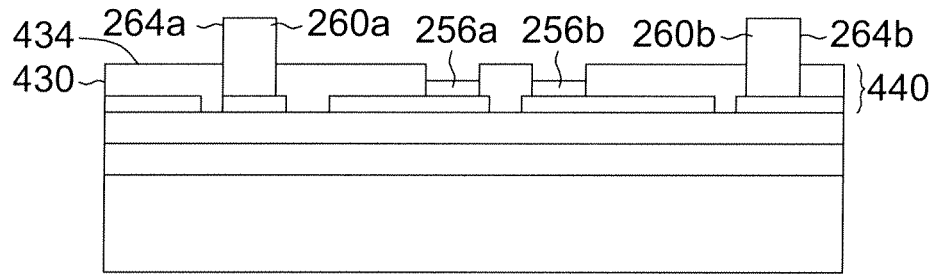
Figure 4M:
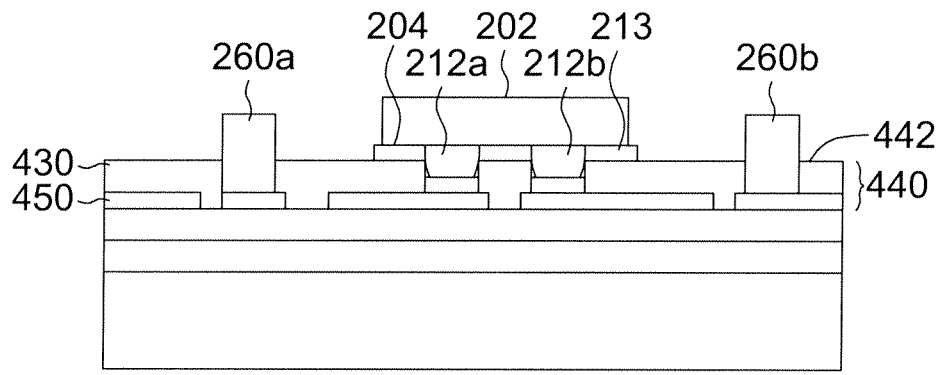

Next, as illustrated in FIG. 4L, the photoresist layer 414 is stripped to expose the upper surface 434 of the layer 430, the plating layers 256a and 256b, and the lateral surfaces 264a and 264b of the electrical interconnects 260a and 260b, respectively. At this stage prior to connection to any semiconductor device 202, both the interconnection structure 440 and the electrical interconnects 260a and 260b have been formed. Again prior to connection to any semiconductor device 202, the interconnection structure 440 and the electrical interconnects 260a and 260b can be tested. As a result, the semiconductor device 202 will be attached (such as illustrated in FIG. 4M) to an interconnection structure 440 and to electrical interconnects 260 that have acceptable performance. This is advantageous because the removal of defective interconnection structures can prevent or reduce loss of semiconductor devices 202 resulting from yield loss in manufacturing of the interconnection structures, such as yield loss due to incorrect patterning.

Next, as illustrated in FIG. 4M, the semiconductor device 202 is disposed adjacent to the upper surface 442 of the interconnection structure 440. The semiconductor device 202 may be flip-chip bonded such that the semiconductor device 202 is electrically connected to the patterned conductive layer 450 and the electrical interconnects 260a and 260b via the connectors 212a and 212b. As described previously, in one embodiment, the underfill layer 213 may optionally be added between the lower surface 204 of the semiconductor device 202 and the layer 430.

Figure 4N:
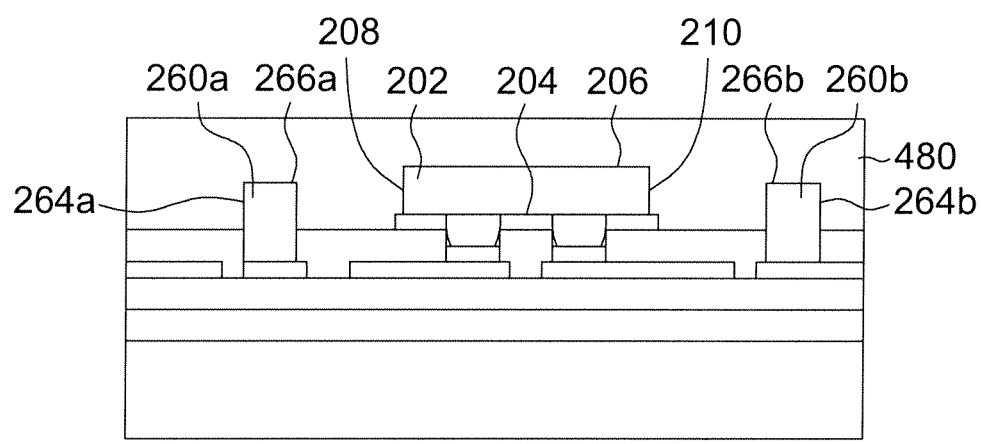

Next, as illustrated in FIG. 4N, a molding material may be applied to form a molded structure 480. The molded structure 480 may substantially cover or encapsulate the top surface 206 and the lateral surfaces 208 and 210 of the semiconductor device 202. The molded structure may also substantially cover or encapsulate the lateral surfaces 264a and 264b and the upper surfaces 266a and 266b of the electrical interconnects 260a and 260b, respectively. The molding material that forms the molded structure 480 can include, for example, a Novolac-based resin, an epoxy-based resin, a silicone-based resin, or another suitable encapsulant. Suitable fillers also can be included, such as powdered $SiO_2$. The molded structure 480 can be formed using any of a number of molding techniques, such as injection molding. Once applied, the molding material is hardened or solidified, such as by lowering the temperature to below a melting point of the molding material, thereby forming the molded structure 480. To facilitate proper positioning of the molded structure 480 during subsequent singulation operations, fiducial marks can be formed in the molded structure 480, such as using laser marking.

Figure 4O:
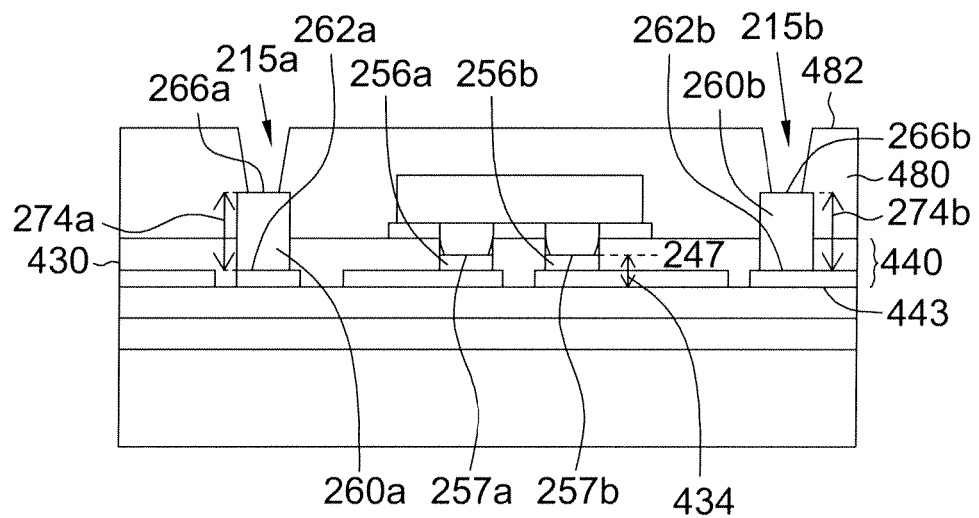

Next, as illustrated in FIG. 4O, the openings 215a and 215b may be formed in the molded structure 480. The openings 215a and 215b may be adjacent to an upper surface 482 of the molded structure 480, and may expose the upper surfaces 266a and 266b of the electrical interconnects 260a and 260b, respectively. The distance 274a is from the upper surface 266a to the lower surface 262a of the electrical interconnect 260a, and the distance 274b is from the upper surface 266b to the lower surface 262b of the electrical interconnect 260b. The distance 434 is from the plane 247 defined by the upper surface 442 of the interconnection structure 440 to the lower surface 443 of the interconnection structure 440. In this embodiment, the plane 247 is defined based on at least one of the upper surfaces 257a and 257b of the plating layers 256a and 256b, respectively. Alternatively, it is contemplated that the distance 434 may be from a different portion of the upper surface 442 to the lower surface 443. For example, the distance 434 may be from the upper surface 434 of the layer 430 to the lower surface 443. At least one of the distances 274a and 274b may be greater than the distance 434.

The openings 215a and 215b may be formed by drilling to remove a portion of the molded structure 480 adjacent to the upper surface 482 of the molded structure 480. It may be advantageous to use laser drilling, rather than mechanical drilling, to minimize the potential for damage to structures encapsulated by the molded structure 480 (such as the electrical interconnects 260, the interconnection structure 440, and the semiconductor device 202) due to the drilling.

Figure 4P:
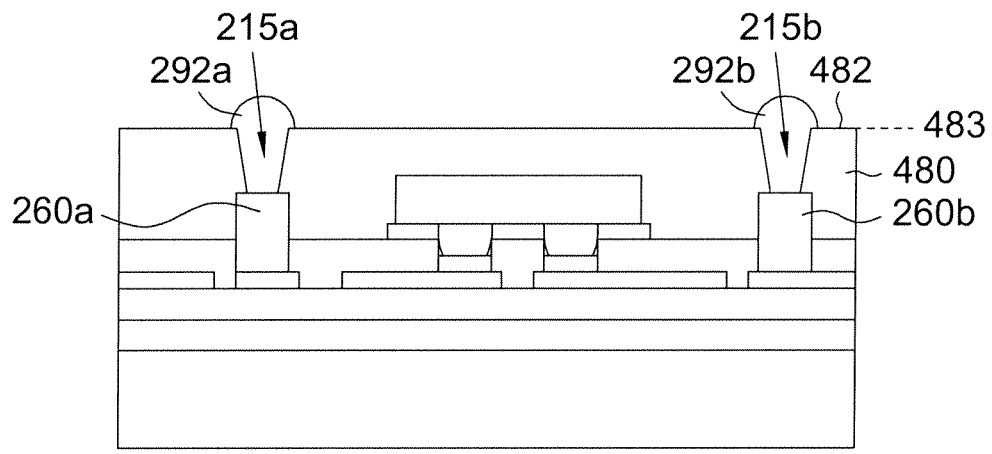

Next, as illustrated in FIG. 4P, the connecting elements 292a and 292b are formed. The connecting elements 292a and 292b may substantially fill the openings 215a and 215b, respectively. In one embodiment, the connecting elements 292 may protrude beyond a plane 483 defined by the upper surface 482 of the molded structure 480. The connecting elements 292a and 292b may be electrically connected to the electrical interconnects 260a and 260b, respectively. As described previously, the connecting elements 292a and 292b may be formed from solder paste, where the solder paste may include at least one of tin, copper, and various other suitable metals. The connecting elements 292a and 292b may be formed through printing, plugging, plating, or through other suitable techniques.

Advantageously, the connecting elements 292a and 292b are formed in openings 215a and 215b drilled into the molded structure 480. This saves process steps over, for example, applying and patterning another photoresist layer after FIG. 4M, forming the connecting elements 292 in openings in the patterned photoresist layer, stripping the photoresist layer, then applying the molded structure 480. Since the openings 215 are drilled into the molded structure 480, no additional photoresist layer needs to be created after FIG. 4M.

Figure 4Q:
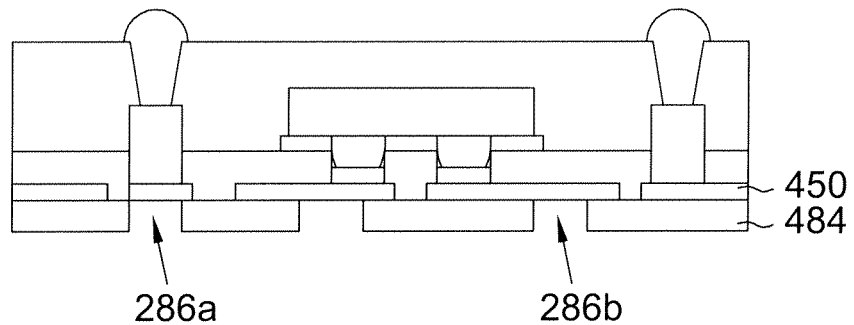

Next, as illustrated in FIG. 4Q, the carrier 400 is removed, exposing the electrically conductive layer 450. A protection layer 484 is then formed adjacent to the electrically conductive layer 450. The protection layer 484 can be formed similarly to the protection layer 284, as described previously. While one protection layer 484 is illustrated in FIG. 4M, it is contemplated that more or less protection layers can be included for other implementations. Openings in the protection layer 484, such as the openings 286a and 286b, may expose portions of the electrically conductive layer 450. The protection layer 484 may be patterned to form the openings 286a and 286b, similarly to the patterning of the layer 430 described previously.

Singulation is next carried out along the dashed lines 490, as illustrated in FIG. 4R. In the illustrated embodiment, singulation may be carried out using a saw (not shown), which forms cutting slits 492. The alignment of the saw during singulation can be aided by fiducial marks, which allow proper positioning of the saw when forming the cutting slits 492. In particular, the cutting slits 492 extend completely through the molded structure 480, the interconnection structure 440, and the protection layer 484, thereby sub-dividing the molded structure 480, the interconnection structure 440, and the protection layer 484 into discrete units, including the package body 214, the interconnection unit 240, and the protection layer 284. After singulation, as illustrated in FIG. 4S, external connectors such as solder bumps may be electrically connected to the interconnection unit 240, such as electrical contacts 294a and 294b in the openings 286a and 286b, respectively.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A stacked assembly, comprising:
a semiconductor package including:
an interconnection unit;
a first semiconductor device disposed adjacent to the interconnection unit and electrically connected to the interconnection unit; and
a package body encapsulating the first semiconductor device, the package body including an upper surface and defining an opening in the upper surface of the package body;
a second semiconductor device disposed on the upper surface of the package body; and
a stacking element extending through the opening in the package body and electrically connecting the first semiconductor device and the second semiconductor device, the stacking element including:
an electrical interconnect including an upper surface and extending vertically from the interconnection unit, at least a portion of the upper surface of the electrical interconnect is planar and is recessed below the upper surface of the package body; and
a conductive bump extending into and filling the opening, the conductive bump being exposed at an external periphery of the stacked assembly.

2. The stacked assembly of claim 1, wherein the semiconductor package includes a patterned conductive layer disposed over the upper surface of the package body, and wherein the second semiconductor device is electrically connected to the conductive bump via the patterned conductive layer.

3. The stacked assembly of claim 1, further comprising a second semiconductor package including:
the second semiconductor device; and
a patterned conductive layer;
wherein the second semiconductor device is electrically connected to the conductive bump.

4. The stacked device assembly of claim 3, wherein the conductive bump protrudes beyond the upper surface of the package body.

* * * * *